United States Patent
Lee et al.

(10) Patent No.: US 9,520,460 B2
(45) Date of Patent: Dec. 13, 2016

(54) MIM CAPACITORS WITH DIFFUSION-BLOCKING ELECTRODE STRUCTURES AND SEMICONDUCTOR DEVICES INCLUDING THE SAME

(71) Applicant: Samsung Electronics Co., Ltd., Suwon-si (KR)

(72) Inventors: Hyun-Suk Lee, Suwon-si (KR); Tae-Kyun Kim, Suwon-si (KR); Jin-Su Lee, Hwaseong-si (KR); Dong-Kyun Park, Seoul (KR); Jong-Myeong Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/340,923

(22) Filed: Jul. 25, 2014

(65) Prior Publication Data
US 2015/0061074 A1  Mar. 5, 2015

(30) Foreign Application Priority Data
Sep. 5, 2013  (KR) .................. 10-2013-0106633

(51) Int. Cl.
*H01L 49/02* (2006.01)
*H01L 27/108* (2006.01)

(52) U.S. Cl.
CPC ............. *H01L 28/75* (2013.01); *H01L 28/90* (2013.01); *H01L 27/1085* (2013.01)

(58) Field of Classification Search
CPC ......... H01L 28/60; H01L 28/75; H01L 27/108
See application file for complete search history.

(56) References Cited

U.S. PATENT DOCUMENTS

| | | |
|---|---|---|
| 6,677,254 B2 | 1/2004 | Narwankar et al. |
| 6,682,969 B1 | 1/2004 | Basceri et al. |
| 6,696,716 B2 | 2/2004 | Basceri et al. |

(Continued)

FOREIGN PATENT DOCUMENTS

| | | |
|---|---|---|
| EP | 1 098 358 B1 | 8/2006 |
| EP | 2 434 529 A1 | 3/2012 |

(Continued)

OTHER PUBLICATIONS

Machine Translation of JP 2004-327770.*

*Primary Examiner* — Daniel Whalen
*Assistant Examiner* — Suberr Chi
(74) *Attorney, Agent, or Firm* — Myers Bigel, P.A.

(57) ABSTRACT

A semiconductor device includes a MIM capacitor on a substrate. The MIM capacitor includes a dielectric region and first and second electrodes on opposite sides of the dielectric region. At least one of the first and second electrodes, e.g., an upper electrode, includes an oxygen diffusion blocking material, e.g., oxygen atoms, at a concentration that decreases in a direction away from the dielectric region. The at least one of the first and second electrodes may include a first layer having a first concentration of the oxygen diffusion blocking material and a second layer on the first layer and having a second concentration of the oxygen diffusion blocking material less than the first concentration. The at least one of the first and second electrodes may further include a third layer on the second layer and having a concentration of the oxygen diffusion blocking material less than the second concentration.

9 Claims, 17 Drawing Sheets

(56) References Cited

U.S. PATENT DOCUMENTS

| | | | |
|---|---|---|---|
| 7,442,604 B2 | 10/2008 | Choi et al. | |
| 8,049,862 B2 * | 11/2011 | Huang et al. | 349/187 |
| 2002/0022334 A1 * | 2/2002 | Yang et al. | 438/396 |
| 2006/0113580 A1 * | 6/2006 | Cho | H01L 27/10852 257/306 |
| 2006/0231028 A1 | 10/2006 | Otsuki | |
| 2006/0234500 A1 | 10/2006 | Park | |
| 2012/0001182 A1 * | 1/2012 | Choi et al. | 257/59 |
| 2012/0098093 A1 * | 4/2012 | Bhat et al. | 257/532 |
| 2012/0309160 A1 | 12/2012 | Ramini et al. | |
| 2013/0200490 A1 * | 8/2013 | Lin et al. | 257/532 |

FOREIGN PATENT DOCUMENTS

| | | | |
|---|---|---|---|
| JP | 2004-327770 | * 11/2004 | H01L 27/108 |
| JP | 4916092 | 2/2012 | |
| KR | 10-2003-0050051 A | 6/2003 | |
| KR | 10-2005-0067502 A | 7/2005 | |
| KR | 10-0510473 | 8/2005 | |
| KR | 10-2010-0078496 A | 7/2010 | |

\* cited by examiner

MIM CAPACITORS WITH DIFFUSION-BLOCKING ELECTRODE STRUCTURES AND SEMICONDUCTOR DEVICES INCLUDING THE SAME

CROSS-REFERENCE TO RELATED APPLICATION

This application claims priority and all the benefits accruing therefrom under 35 U.S.C. 119 from Korean Patent Application No. 10-2013-0106633, filed on Sep. 5, 2013 in the Korean Intellectual Property Office, the content of which is herein incorporated by reference in its entirety.

BACKGROUND

1. Technical Field

The present inventive subject matter relates to semiconductor devices and methods of fabricating the same and, more particularly, to MIM capacitors, semiconductor devices including MIM capacitors, and methods of fabricating the same.

2. Description of the Related Art

Generally, as the integration density of semiconductor devices, e.g., dynamic random access memory (DRAM) devices, increases, the area of a unit cell decreases, and the area occupied by a capacitor also decreases. Due to this reduction in the area of the capacitor, it becomes more problematic to fabricate a capacitor having a desired capacitance. Accordingly, to support greater integration density in semiconductor devices, there is a need for improved structures that may provide desirable capacitance.

If the thickness of a dielectric film used in a capacitor is reduced in order to increase capacitance, leakage current characteristics may be deteriorated. Therefore, a dielectric film having a high dielectric constant, i.e., a high dielectric film, may be employed. If a high dielectric film is used in a capacitor and a low dielectric film is formed between the high dielectric film and a polysilicon film of an upper electrode, and a desired capacitance may not be obtained.

Accordingly, metal-insulator-metal (MIM) capacitors have been introduced to replace metal-insulator-semiconductor (MIS) capacitors. However, in the metal-insulator-metal (MIM) capacitor, a high dielectric film may react with the upper electrode to reduce the capacitance. Techniques for reducing such reactions may increase the resistance of the upper electrode, which may degrade performance of the semiconductor device.

SUMMARY

Some embodiments of the present inventive subject matter provide a MIM capacitor capable of preventing a reduction in capacitance of a high dielectric film while reducing resistance of an upper electrode.

Some embodiments provide a semiconductor device including a MIM capacitor capable of preventing a reduction in capacitance of a high dielectric film while reducing resistance of an upper electrode.

Some embodiments provide a method of fabricating a MIM capacitor capable of preventing a reduction in capacitance of a high dielectric film while reducing resistance of an upper electrode.

According to some embodiments, a MIM capacitor includes a lower electrode, a dielectric film on the lower electrode and an upper electrode on the dielectric film. The upper electrode includes a first electrode including a first material, e.g., oxygen atoms, at a first concentration. A second electrode is disposed on the first electrode and includes the first material at a second concentration. A third electrode is disposed on the second electrode and has a third concentration of the first material.

The first, second, and third electrodes may be layers stacked on the dielectric film. The first electrode may be thinner than each of the second and third electrodes. The first electrode may have a thickness of about 1 Å to about 50 Å. The third electrode may be thicker than each of the first and second electrodes. The second concentration may be lower than the first concentration and higher than the third concentration. The third electrode may be substantially free of the first material. In some embodiments, the second concentration may decrease from a bottom to a top of the second electrode.

A protective film may be disposed between the dielectric film and the upper electrode.

Further embodiments provide a semiconductor device including a substrate and a metal-insulator-metal (MIM) capacitor on the substrate. The MIM capacitor includes a lower electrode, a dielectric film on the lower electrode and an upper electrode on the dielectric film. The upper electrode includes a first material, e.g., oxygen atoms, at a concentration that decreases from a bottom of the upper electrode to a top of the upper electrode.

The upper electrode may include a metal film substantially free of the first material. The metal film may provide an upper surface of the upper electrode.

Still further embodiments provide a semiconductor device including a substrate and a MIM capacitor on the substrate. The MIM capacitor includes a dielectric region and first and second electrodes on opposite sides of the dielectric region. At least one of the first and second electrodes comprises an oxygen diffusion blocking material at a concentration that decreases in a direction away from the dielectric region. The oxygen diffusion blocking material may include oxygen atoms.

In some embodiments, the at least one of the first and second electrodes includes a first layer having a first concentration of the oxygen diffusion blocking material and a second layer on the first layer and having a second concentration of the oxygen diffusion blocking material less than the first concentration. The at least one of the first and second electrodes may further include a third layer on the second layer and having a concentration of the oxygen diffusion blocking material less than the second concentration. The third layer may be substantially free of the oxygen diffusion blocking material.

Embodiments of the present inventive subject matter are not restricted to the ones set forth herein. The above and other aspects of the present inventive subject matter will become more apparent to one of ordinary skill in the art to which the present inventive subject matter pertains by referencing the detailed description of the present inventive subject matter given below.

BRIEF DESCRIPTION OF THE DRAWINGS

The above and other aspects and features of the present inventive subject matter will become more apparent by describing in detail exemplary embodiments thereof with reference to the attached drawings, in which.

DETAILED DESCRIPTION

Figure 1:
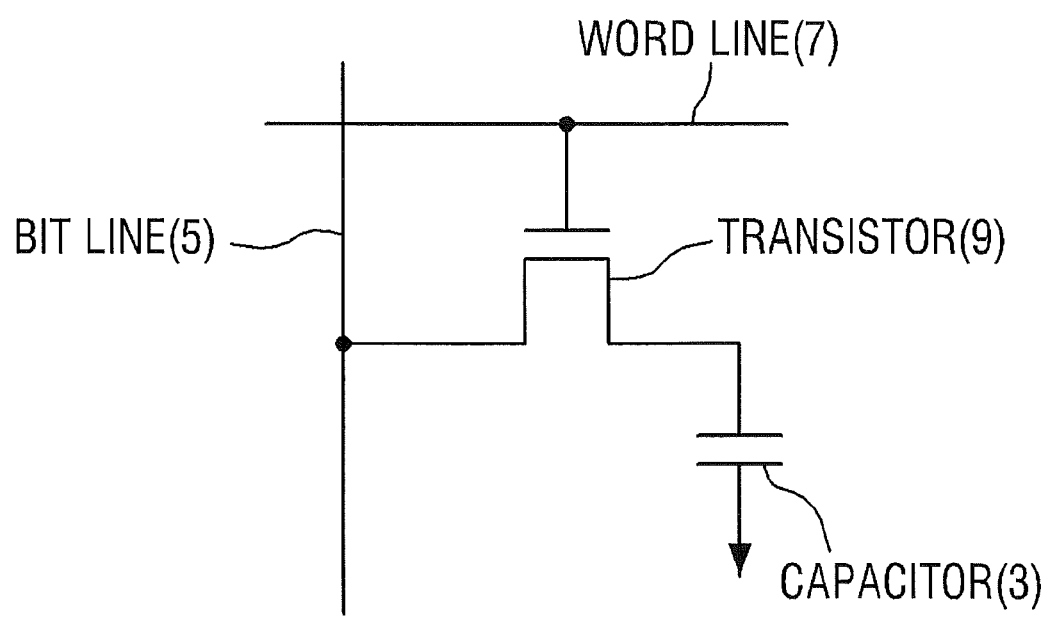
FIG. 1 is a circuit diagram of a unit cell of a DRAM device to which the present inventive subject matter is applicable.

Advantages and features of the present inventive subject matter may be understood more readily by reference to the following detailed description of embodiments and the accompanying drawings. The present inventive subject matter may, however, be embodied in many different forms and should not be construed as being limited to the embodiments set forth herein. Rather, these embodiments are provided so that this disclosure will be thorough and complete and will fully convey the concept of the inventive subject matter to those skilled in the art, and the present inventive subject matter will only be defined by the appended claims. Like reference numerals refer to like elements throughout the specification.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Some embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive subject matter.

Unless otherwise defined, all terms (including technical and scientific terms) used herein have the same meaning as commonly understood by one of ordinary skill in the art to which the present inventive subject matter belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a circuit diagram of a unit cell of a DRAM device to which the present inventive subject matter is applicable. Although a unit cell of a DRAM device may have a variety of forms, a unit cell consisting of one transistor 9 and one capacitor 3 is illustrated as an example.

The transistor 9 is connected to a word line 7. A bit line 5 is connected to a source/drain region of the transistor 9. The capacitor 3 is connected to another source/drain region of the transistor. Some embodiments of the present inventive subject matter relate to the capacitor 3 of the unit cell.

Figure 2:
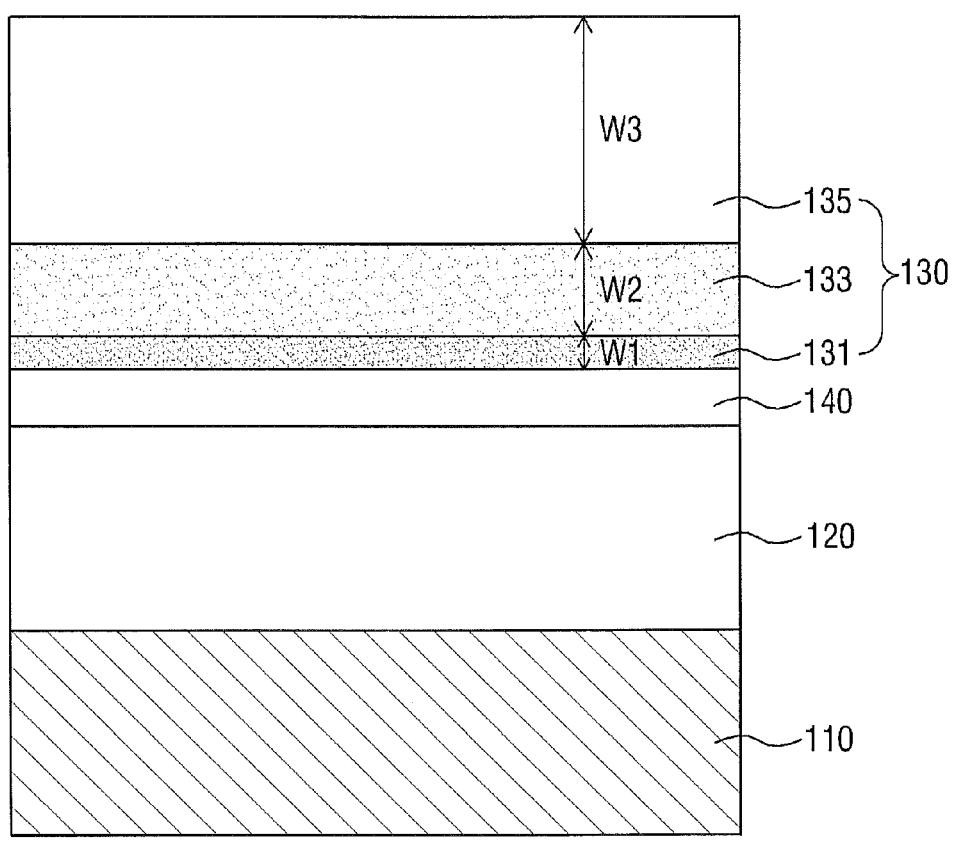
FIG. 2 is a cross-sectional view conceptually showing a MIM capacitor according to some embodiments of the present inventive subject matter.

A MIM capacitor 100 according to some embodiments of the present inventive subject matter will be described with reference to FIG. 2, which is a cross-sectional view conceptually showing the MIM capacitor 100. Referring to FIG. 2, the MIM capacitor 100 may include a lower electrode 110, a dielectric film 120, an upper electrode 130 and a protective film 140.

The lower electrode 110 is a film formed of a conductive material. The lower electrode 110 may be formed of, for example, TiN, TiAlN, TaN, W, WN, Ru, $RuO_2$, $SrRuO_3$, Ir, $IrO_2$, platinum, iridium or a combination thereof, but it is not limited thereto. The lower electrode 110 may be formed by, for example, physical vapor deposition (PVD), chemical vapor deposition (CVD), and/or atomic layer deposition (ALD).

The dielectric film 120 is formed on the lower electrode 110. In FIG. 2, the dielectric film 120 is illustrated as one layer, but it is not limited thereto. For example, the dielectric film 120 may be formed by stacking a metal oxide film on a metal nitride film, each of which may be formed by atomic layer deposition (ALD). In some embodiments, the dielectric film 120 may be formed from three or more layers.

The dielectric film 120 may be a film with a high dielectric constant. For example, the dielectric film 120 may include a $ZrO_2$ film, an $HfO_2$ film, a $Ta_2O_3$ film, or a combination thereof, but it is not limited thereto. In some embodiments, the dielectric film 120 may include an aluminum nitride (AlN) film, a boron nitride (BN) film, a zirconium nitride ($Zr_3N_4$) film, a hafnium nitride ($Hf_3N_4$) film and/or another type of nitride film.

The protective film 140 is formed on the dielectric film 120. The protective film 140 is formed in contact with the dielectric film 120, and may be electrically conductive. The protective film 140 may reduce or prevent diffusion of oxygen atoms (O) from the dielectric film 120 into the upper electrode 130. Oxygen atoms (O) included in the dielectric film 120 may react with metal, for example, Ti, included in the upper electrode 130. If the oxygen atoms (O) react with the upper electrode 130, the capacitance of the dielectric film 120 may decrease and the leakage current of the MIM capacitor 100 may increase. In order to reduce or eliminate this phenomenon, the protective film 140 formed between the dielectric film 120 and the upper electrode 130 may prevent the oxygen atoms (O) included in the dielectric film 120 from reacting with the upper electrode 130. The protective film 140 may be an oxide film, for example, a TiO film.

The upper electrode 130 is formed on the protective film 140 in contact with the protective film 140. The upper electrode 130 may include a conductive metal nitride, for example, titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN) and/or manganese nitride ($Mn_4N$). The upper electrode 130 may further include a first material, for example, oxygen atoms (O). The first material included in the upper electrode 130 may reduce or pervert reaction of the upper electrode 130 with oxygen atoms included in the dielectric film 120 and/or the protective film 140. In order to reduce or prevent diffusion of oxygen atoms from the dielectric film 120 into the upper electrode 130 to react with the upper electrode 130, the protective film 140 is formed between the dielectric film 120 and the upper electrode 130, but some of the oxygen atoms included in the dielectric film 120 may diffuse into the upper electrode 130. Since the protective film 140 also includes oxygen atoms, oxygen atoms (O) included in the protective film 140 may react with the upper electrode 130. Thus, in order to reduce or prevent reaction of the oxygen atoms included in the dielectric film 120 and the protective film 140 with the upper electrode 130, the upper electrode 130 may include the first material.

However, as the amount of the first material included in the upper electrode 130 increases, the resistance of the upper electrode 130 may increase. Thus, in order to reduce or prevent diffusion of the oxygen atoms included in the dielectric film 120 and the protective film 140 into the upper electrode 130 and maintain a desired resistance of the upper electrode 130, the concentration of the first material in the upper electrode 130 may differ according to a distance to the dielectric film 120. For example, concentration of the first material may decrease from the bottom to the top of the upper electrode 130. In a portion in contact with the protective film 140, the first material included in the upper electrode 130 may have the highest concentration. With increasing distance from the protective film 140, the concentration of the first material included in the upper electrode 130 may be reduced.

The upper electrode 130 may include a first electrode 131, a second electrode 133 and a third electrode 135. The first to third electrodes 131, 133 and 135 may be sequentially stacked on the protective film 140, with the first electrode 131 disposed nearest to the dielectric film 120 and the third electrode 135 is disposed farthest from the dielectric film 120. The first electrode 131 may be disposed in a lower portion of the upper electrode 130, the third electrode 135 may be disposed in an upper portion of the upper electrode 130, and the second electrode 133 may be disposed between the first electrode 131 and the third electrode 135.

The first electrode 131 may include the first material at a first concentration, the second electrode 133 may include the first material at a second concentration, and the third electrode 135 may include the first material at a third concentration. The first concentration may be the greatest, the third concentration may be the least, and the second concentration may be between the first concentration and the third concentration. The first concentration may have a value to reduce or prevent the oxygen atoms of the dielectric film 120 and/or the protective film 140 from diffusing into the upper electrode 130. The second concentration may decrease from the bottom to the top of the second electrode 133. The third concentration may be lower than the first and second concentrations, and may be substantially near zero, i.e., the third electrode 135 may be substantially free of the first material.

Since the first concentration of the first electrode 131 in contact with the protective film 140 is the greatest, diffusion of the oxygen atoms (O) included in the protective film 140 into the first electrode 131 may be significantly reduced or prevented. Further, since the content of the first material decreases toward the third electrode 135 through the second electrode 133, an undesirable increase in resistance of the upper electrode 130 due to the first material may be avoided.

The first electrode 131 may have a first thickness W1, the second electrode 133 may have a second thickness W2, and the third electrode 135 may have a third thickness W3. The first thickness W1 may be less than the second thickness W2 and less than the third thickness W3. The third thickness W3 may be greater than the first thickness W1, and greater than the second thickness W2. The first thickness W1, the second thickness W2 and the third thickness W3 may have a relationship of W3>W2>W1.

The first electrode 131 including the first material at the first concentration may be formed to have a thickness of, for example, 1 Å to 50 Å, to significantly reduce or prevent the diffusion of oxygen atoms included in the protective film 140. The third electrode 135 having the third concentration may be formed to have the largest thickness to provide a desirable resistance of the upper electrode 130. If the first electrode 131 has a thickness greater than 50 Å, the resistance of the upper electrode 130 may increase above a desirable level.

Figure 3:
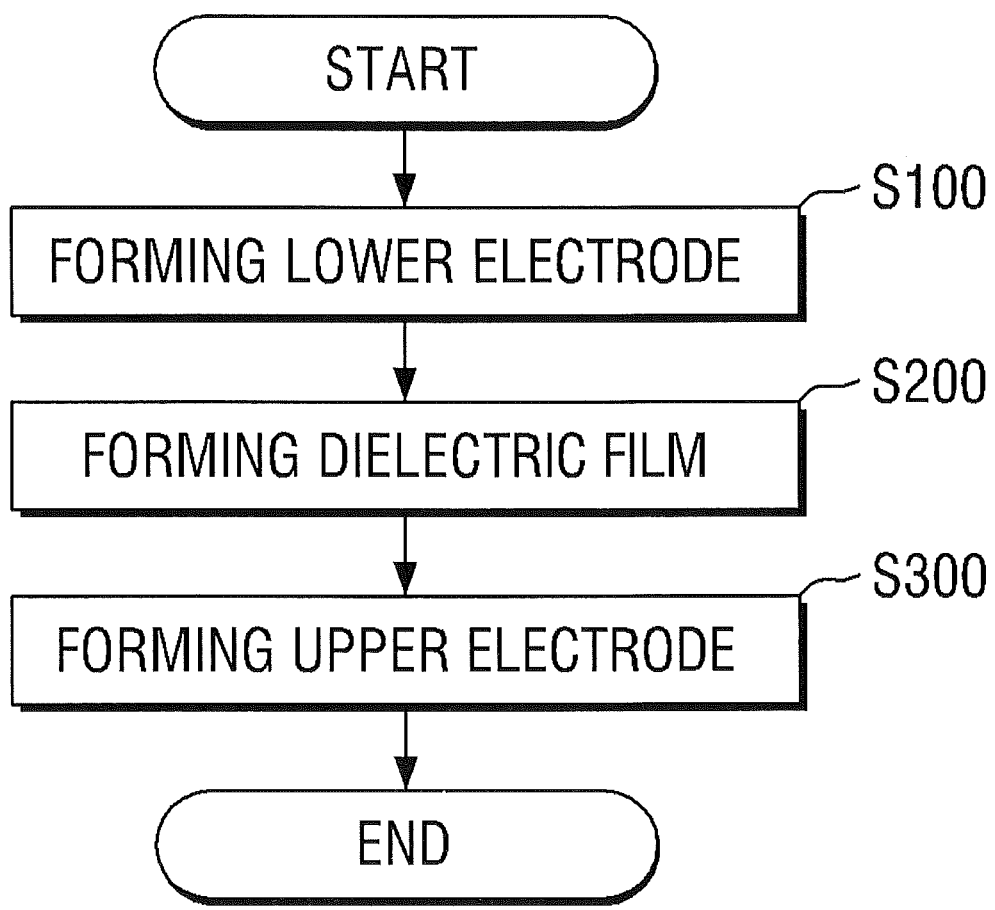
FIG. 3 is a flowchart illustrating operations for fabricating a MIM capacitor according to some embodiments.
Figure 4:
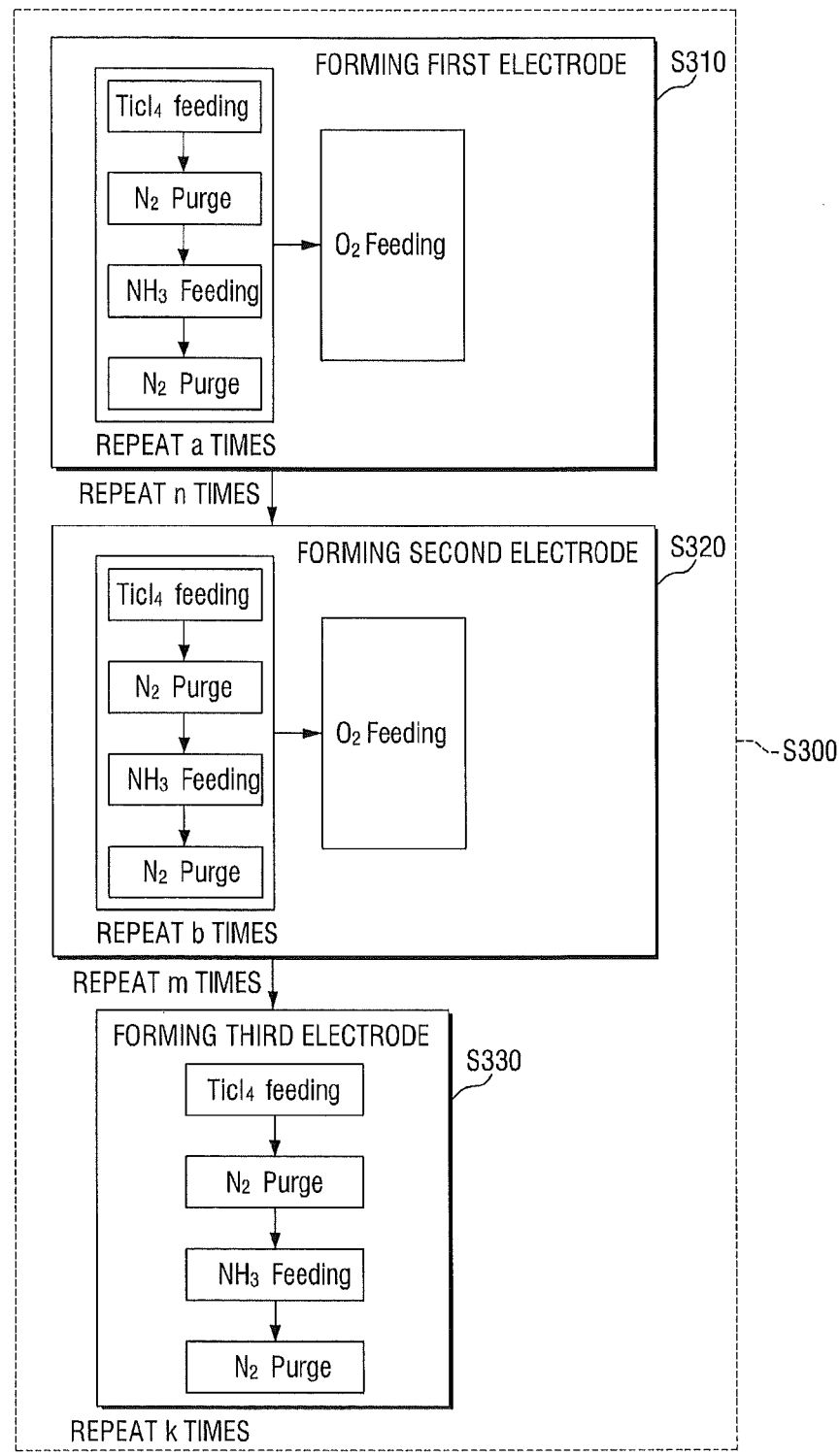
FIG. 4 is a flowchart illustrating operations for fabricating an upper electrode of FIG. 3 according to some embodiments.
Figure 8:
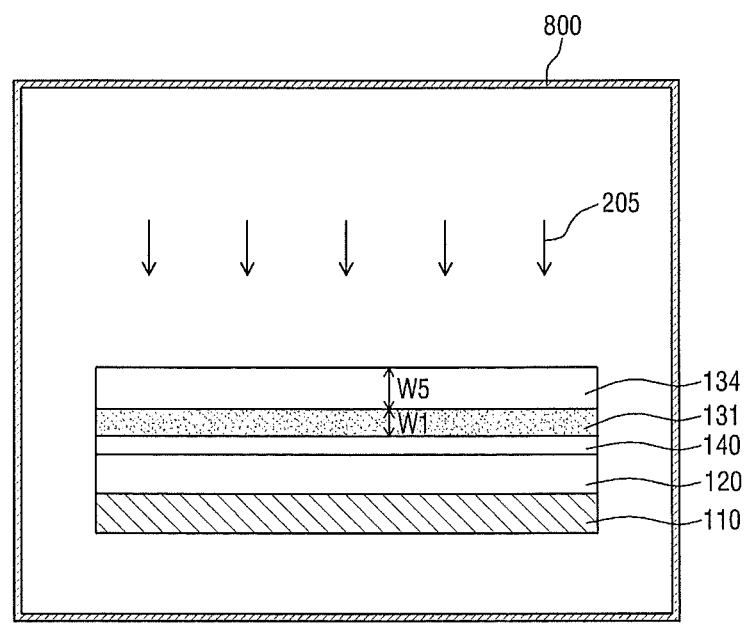
Figure 9:
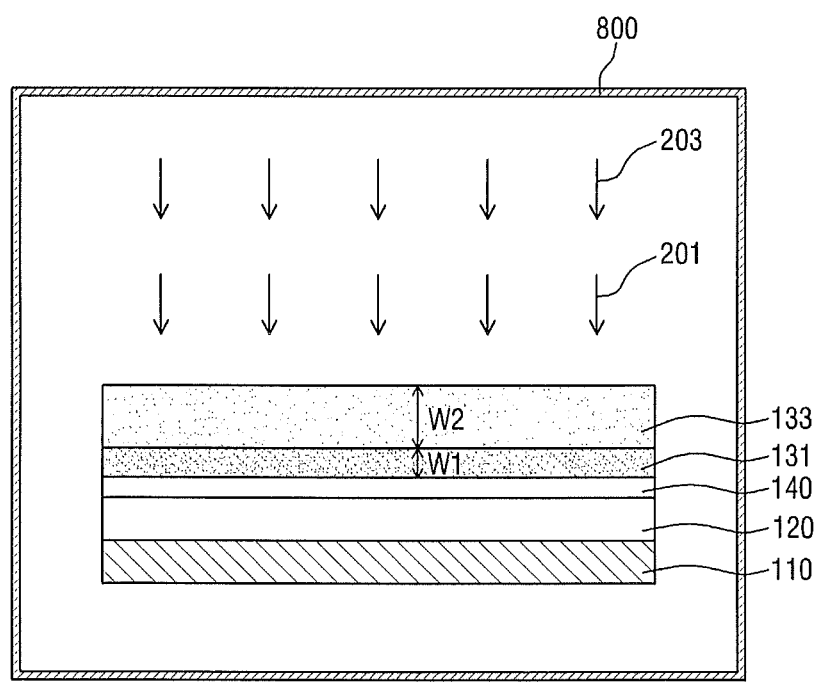
Figure 10:
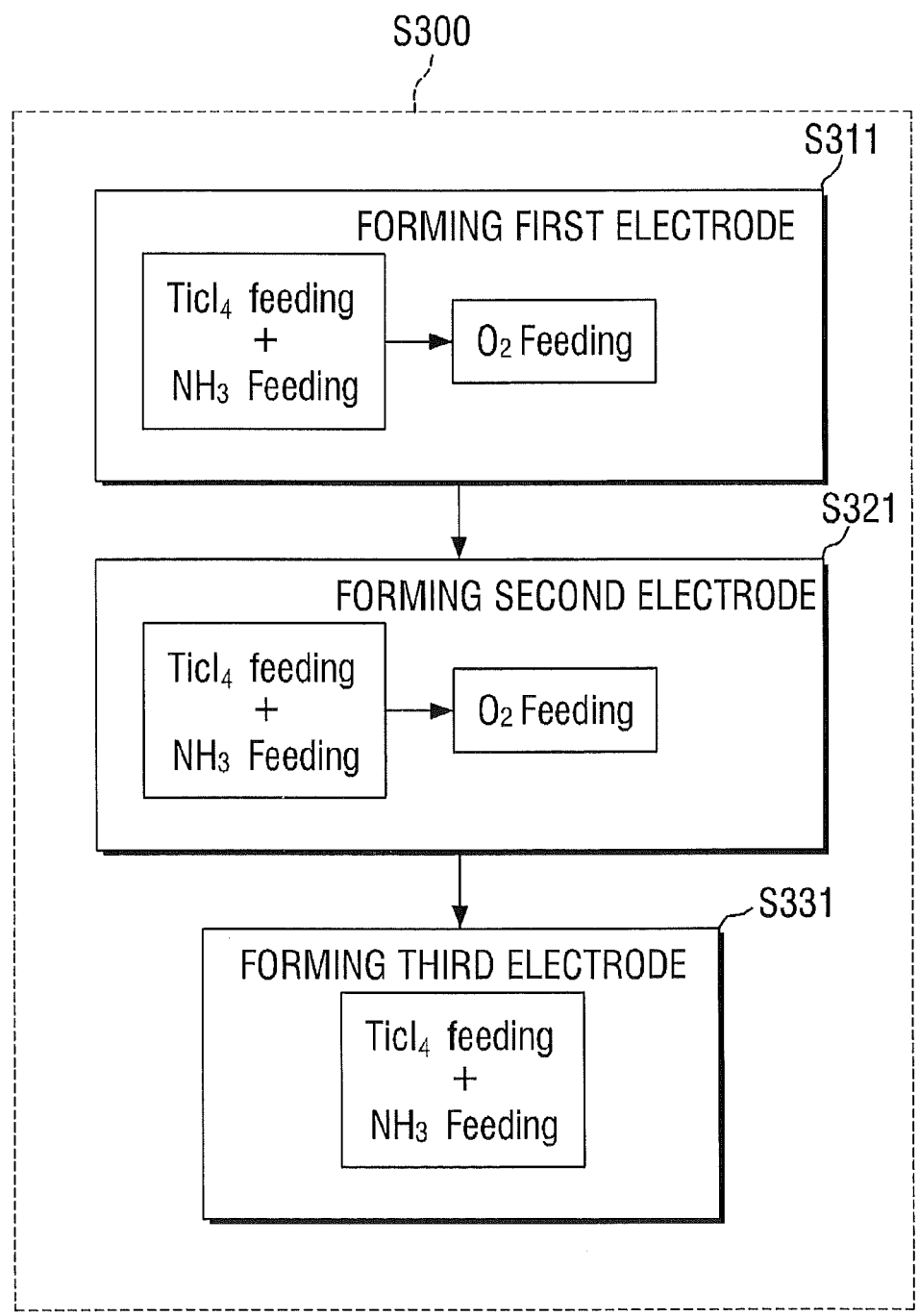
FIG. 10 is a flowchart illustrating operations for fabricating the upper electrode of FIG. 3 according to further embodiments.
Figure 14:
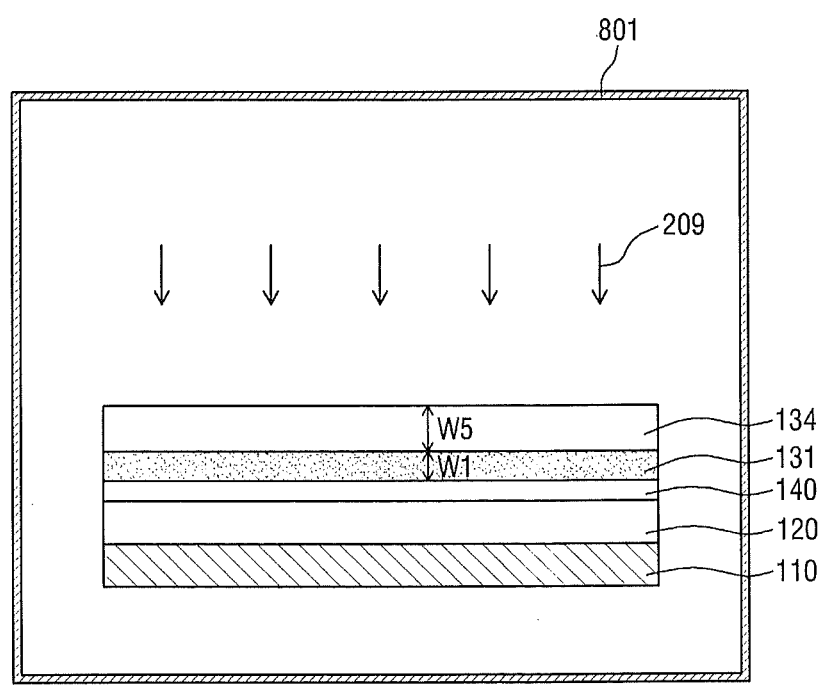
Figure 15:
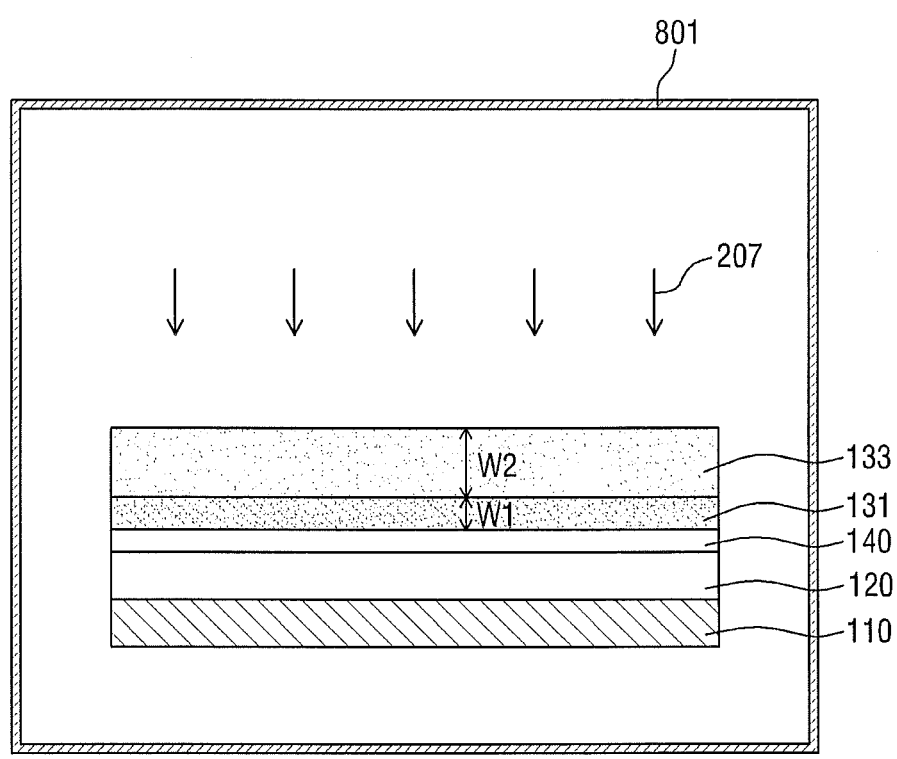
Figure 16:
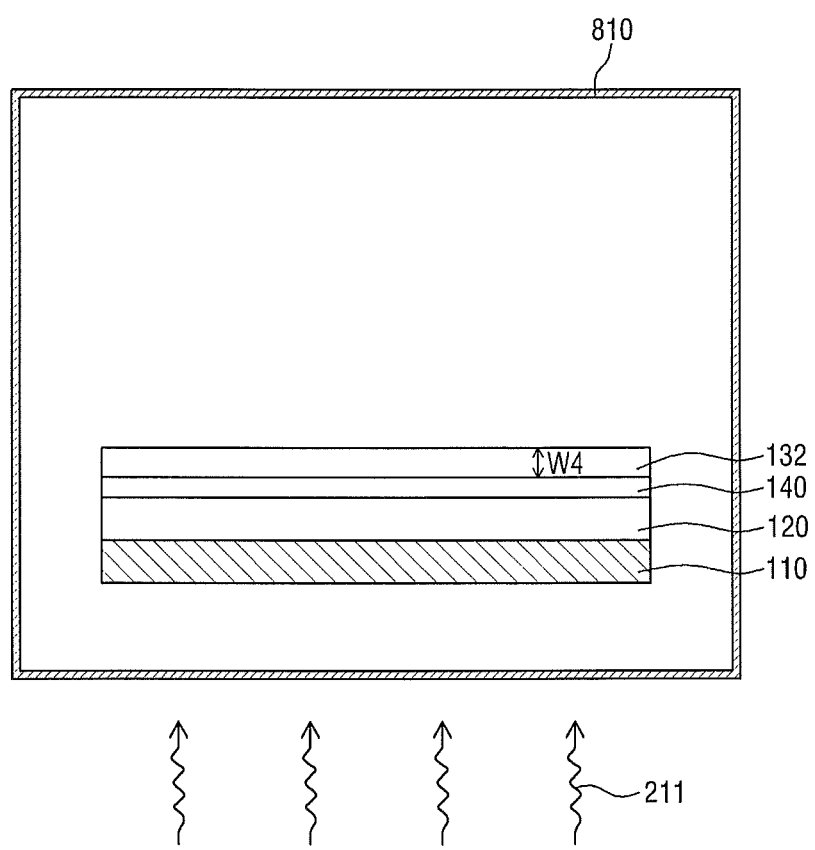
FIGS. 16 and 17 are cross-sectional views showing intermediate operations for fabricating an upper electrode according to further embodiments.
Figure 17:
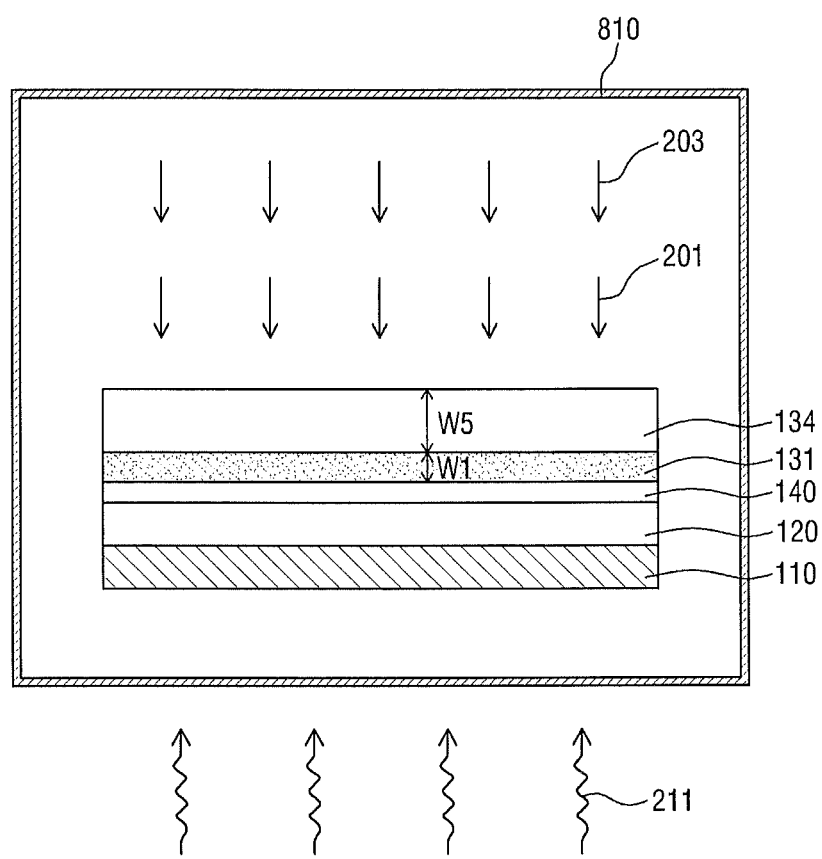

Operations for fabricating a MIM capacitor will be described with reference to FIGS. 2 to 18. FIG. 3 is a flowchart illustrating operations for fabricating a MIM capacitor according to some embodiments, and FIG. 4 is a flowchart illustrating operations for fabricating the upper electrode 130 of FIG. 3 according to further embodiments. FIGS. 5 to 9 are cross-sectional views showing intermediate steps of the operations of FIG. 4. FIG. 10 is a flowchart illustrating operations for fabricating the upper electrode 130 of FIG. 3 according to further embodiments. FIGS. 11 to 15 are cross-sectional views showing intermediate steps of the operations of FIG. 10. FIGS. 16 and 17 are cross-sectional views showing intermediate steps of operations for fabricating the upper electrode 130 according to still further embodiments.

Referring to FIGS. 2 and 3, the lower electrode 110 is formed (step S100). The lower electrode 110 may be a conductive film. Subsequently, the dielectric film 120 is formed on the lower electrode 110 (step S200). The dielectric film 120 may be a film with a high dielectric constant. The upper electrode 130 is formed on the dielectric film 120 (step S300). The upper electrode 130 also may include a conductive film made of, for example, TiN, in the same way as the lower electrode 110. The upper electrode 130 may include the first material, for example, oxygen atoms (O) in order to reduce or prevent diffusion of the oxygen atoms included in the dielectric film 120 into the upper electrode 130. The upper electrode 130 may include Ti, N, O, and the like.

In order to reduce or prevent diffusion of the oxygen atoms included in the dielectric film 120 into the upper electrode 130, the protective film 140 may be additionally formed between the dielectric film 120 and the upper electrode 130.

An ALD process, CVD process, annealing process or the like may be used to form the upper electrode 130 including the first material.

Operations for forming the upper electrode 130 using an ALD process will now be described. The ALD process may be carried out as an in situ process. In other words, the upper electrode 130 may be formed in one chamber 800.

Figure 5:
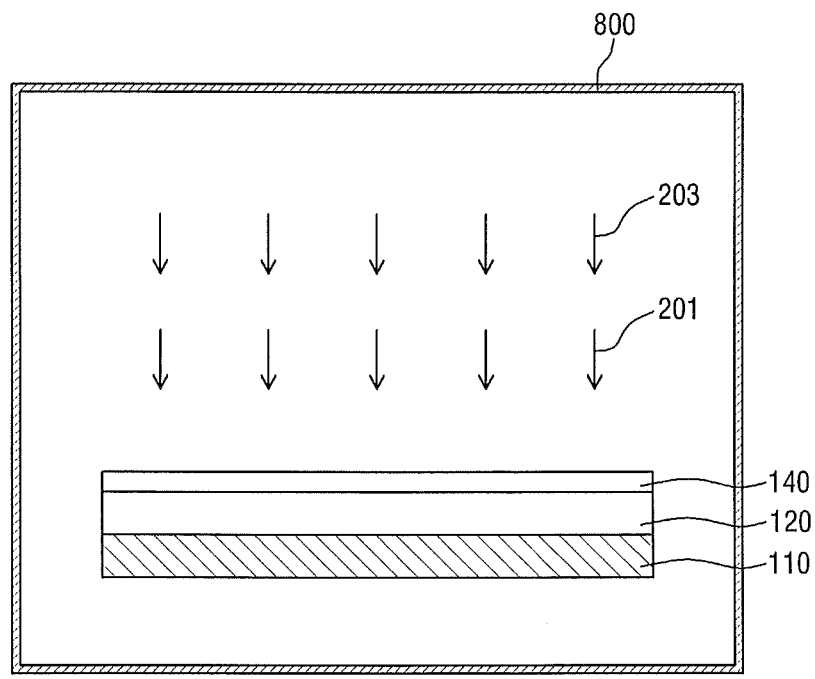
FIGS. 5 to 9 are cross-sectional views showing intermediate operations for the process of FIG. 4 according to some embodiments.
Figure 6:
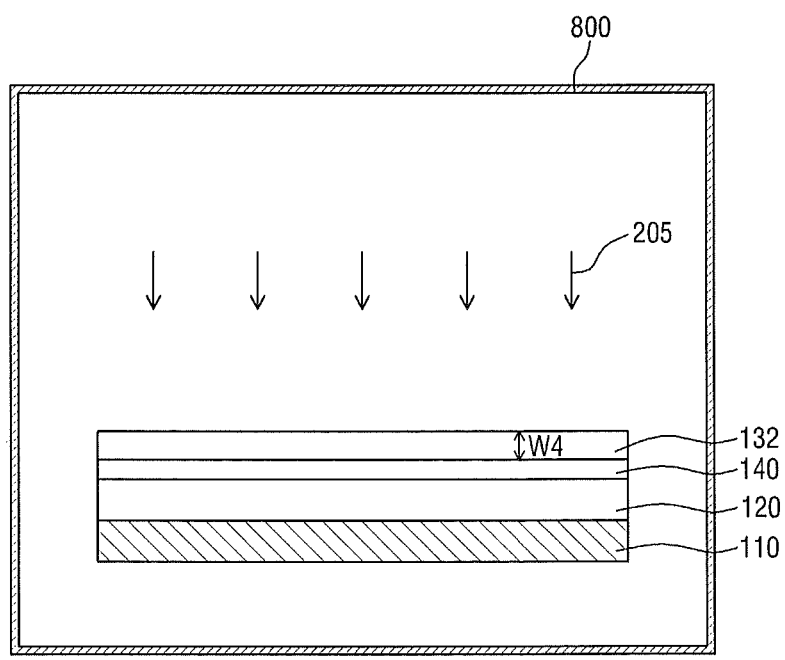

Referring to FIG. 4, the first electrode 131 is formed (step S310). In order to form the first electrode 131 in the chamber 800, as shown in FIG. 5, $TiCl_4$ is injected onto the protective film 140 as represented by arrows 201, and a purge gas is injected thereon. Then, $NH_3$ is injected thereon as represented by arrows 203, and a purge gas is injected again. Upon repeating the above process a times, a first sub electrode 132 may be formed as shown in FIG. 6. The first sub electrode 132 may have a fourth thickness W4.

The first electrode 131 including, for example, TiON and the first material, may be formed by injecting the first material in the chamber 800. Upon repeating the above process n times, the first electrode 131 having the first thickness W1 may be formed, i.e., the first electrode 131 may be formed by supplying the first material to the first sub electrode 132. The first concentration of the first material in the first electrode 131 may be adjusted by adjusting the number a of repetitions. Specifically, in order to increase the first concentration, after forming the first sub electrode 132 having the fourth thickness W4 which has been decreased by reducing the number a of repetitions, the first material is injected in the chamber 800 as represented by arrows 205. In order to decrease the first concentration, after forming the first sub electrode 132 having the thickness W4 which has been increased by increasing the number a of repetitions, the first material is injected in the chamber 800. The first concentration and the number a of repetitions are inversely proportional. The first thickness W1 of the first electrode 131 may be adjusted by adjusting the number n of repetitions.

Figure 7:
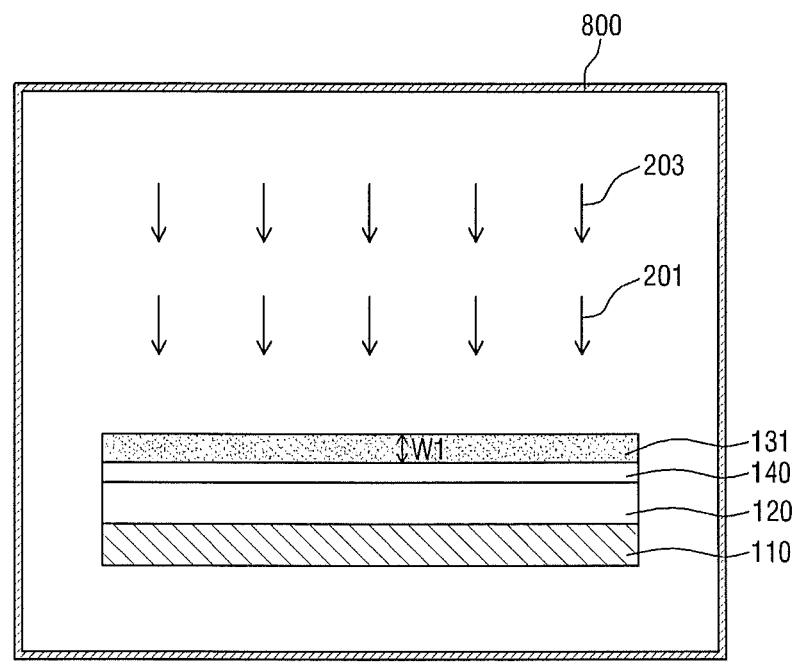

Referring again to FIG. 4, the second electrode 133 is formed on the first electrode 131 (step S320). As shown in FIG. 7, $TiCl_4$ (represented by arrows 201), a purge gas and $NH_3$ (represented by arrows 203) are sequentially injected in the chamber 800 in order to form a second sub electrode 134. Upon repeating the above process b times, the second sub electrode 134 having a fifth thickness W5 may be formed as shown in FIG. 8. The second electrode 133 including the first material may be formed by injecting the first material in the chamber 800 as represented by arrows 205. Upon repeating the above process m times, the second electrode 133 having the second thickness W2 may be formed, i.e., the second electrode 133 may be formed by supplying the first material to the second sub electrode 134. The second concentration of the first material in the second electrode 133 may be adjusted by adjusting the number b of repetitions. Since the thickness W4 of the second sub electrode 134 increases as the number b of repetitions increases, the second concentration may decrease. Since the thickness W4 of the second sub electrode 134 decreases as the number b of repetitions decreases, the second concentration may increase. The thickness W1 of the second electrode 133 may be adjusted by adjusting the number m of repetitions.

Since the second concentration of the first material is lower than the first concentration of the first material, b may be greater than a, and since the thickness W1 of the first electrode 131 is less than the thickness W2 of the second electrode 133, n may be less than m.

Referring again to FIG. 4, the third electrode 135 is formed on the second electrode 133 (step S330). As shown in FIG. 9, $TiCl_4$ (represented by arrows 201), a purge gas, $NH_3$ (represented by arrows 203) and a purge gas are sequentially injected in the chamber 800 in order to form the third electrode 135. By repeating the above process k times, the third electrode 135 having the third thickness W3 may be formed as shown in FIG. 2. Since the third electrode 135 may be substantially free of the first material, the first material (to be represented by arrows 209) may not be injected in the chamber 800.

The thickness W3 of the third electrode 135 may be adjusted by adjusting the number k of repetitions. Since the thickness W3 of the third electrode 135 is greater than that of the first electrode 131 and greater than that of the second electrode 133, k may be greater than n and greater than m.

Operations for forming the upper electrode 130 using a CVD process will now be described. The CVD process may be carried out as an in situ process. In other words, the upper electrode 130 may be formed in one chamber 801.

Figure 11:
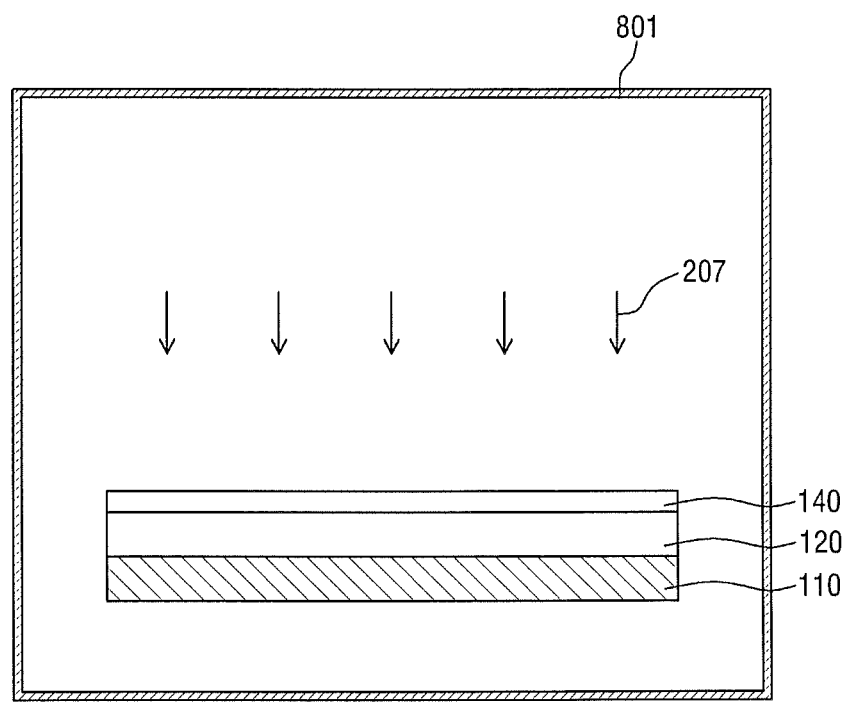
FIGS. 11 to 15 are cross-sectional views showing intermediate operations for the process of FIG. 10 according to some embodiments.
Figure 12:
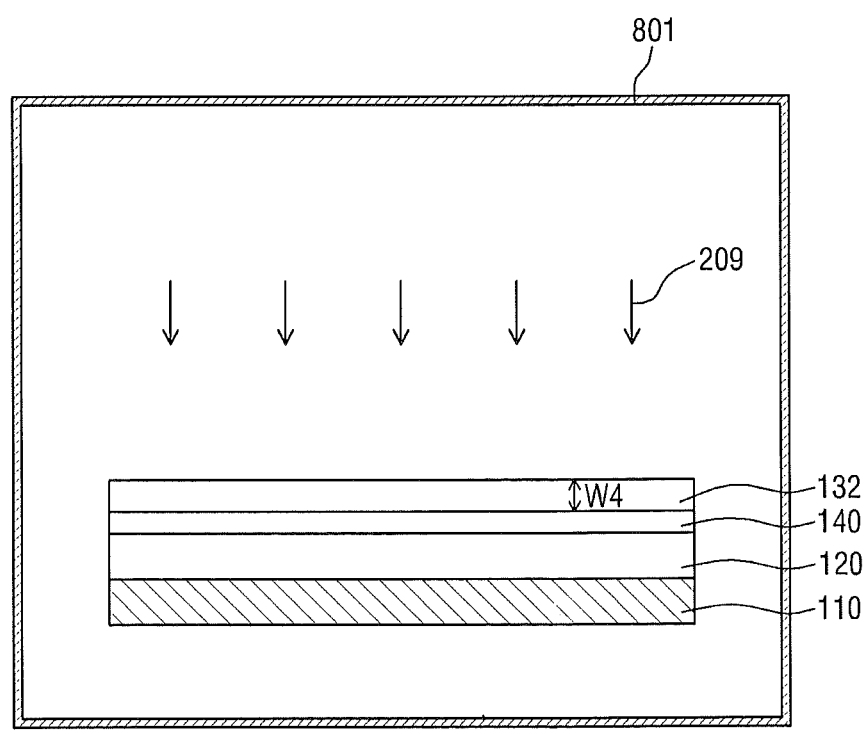

Referring to FIG. 10, the first electrode 131 is formed (step S311). As shown in FIG. 11, $TiCl_4$ and $NH_3$ are injected in the chamber 801 at the same time as represented by arrows 207. By injecting TiCl$_4$ and NH$_3$ at the same time as represented by arrows 207, the first sub electrode 132 may be formed on the protective film 140 as shown in FIG. 12. A fourth thickness W4 of the first sub electrode 132 may be adjusted by adjusting the injection amount and injection time of TiCl$_4$ and NH$_3$.

Figure 13:
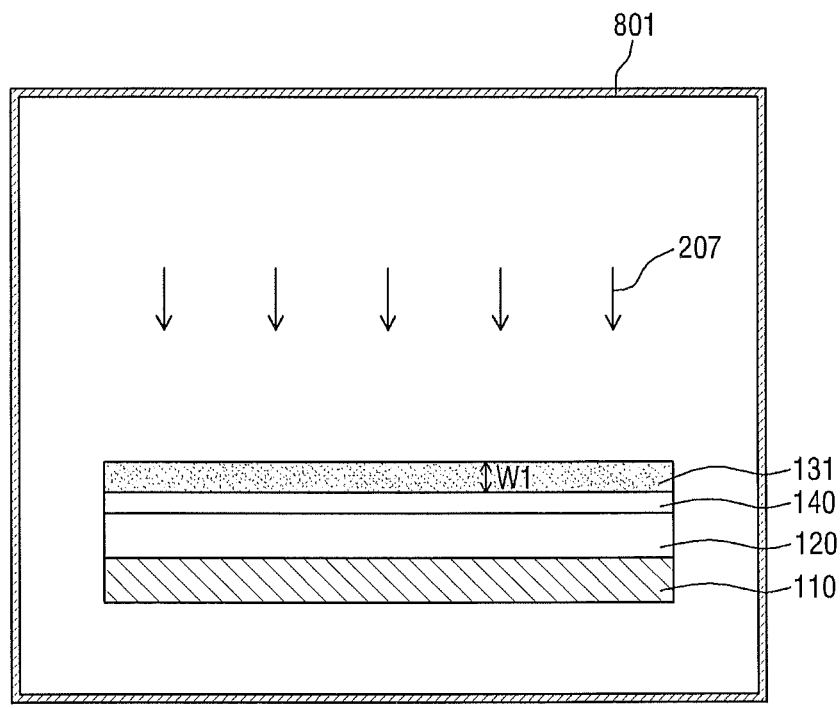

After the first sub electrode 132 is formed, the first material is injected in the chamber 801 as represented by arrows 209, thereby forming the first electrode 131 as shown in FIG. 13. The first electrode 131 may have the first thickness W1, and may include the first material at a first concentration.

Referring again to FIG. 10, the second electrode 133 is formed on the first electrode 131 (step S321). As shown in FIG. 13, TiCl$_4$ and NH$_3$ are injected in the chamber 801 at the same time as represented by arrows 207. By injecting TiCl$_4$ and NH$_3$ at the same time as represented by arrows 207, the second sub electrode 134 may be formed on the first electrode 131 as shown in FIG. 14. The fifth thickness W5 of the second sub electrode 134 may be adjusted by adjusting the injection amount and injection time of TiCl$_4$ and NH$_3$.

After the second sub electrode 134 is formed, the first material is injected in the chamber 801 as represented by arrows 209 in FIG. 14. The first material reacts with the second sub electrode 134, and the second electrode 133 may be formed as shown in FIG. 15. The second electrode 133 may have the second thickness W2, and may include the first material at a second concentration.

The fourth thickness W4 of the first sub electrode 132 is less than the fifth thickness W5 of the second sub electrode 134. The first and second sub electrodes 132 and 134 react with the same amount of the first material. Thus, the first thickness W1 of the first electrode 131 is less than the second thickness W2 of the second electrode 133, and the first concentration is higher than the second concentration.

Referring again to FIG. 10, the third electrode 135 is formed on the second electrode 133 (step S331). As shown in FIG. 15, TiCl$_4$ and NH$_3$ are injected in the chamber 801 at the same time as represented by arrows 207. By injecting TiCl$_4$ and NH$_3$ at the same time as represented by arrows 207, the third electrode 135 may be formed on the second electrode 133 as shown in FIG. 2. Since the third electrode 135 may be substantially free of the first material, the first material may not be injected in the chamber 801. The third thickness W3 of the third electrode 135 may be adjusted by adjusting the injection amount and injection time of TiCl$_4$ and NH$_3$. Since the thickness relationship (W1<W2<W3) and concentration relationship (first concentration>second concentration>third concentration) of the electrodes 131, 133 and 135 included in the upper electrode 130 have been described above, repeated description thereof will be omitted.

Operations for forming the upper electrode 130 using an annealing process will now be described. The annealing process may be carried out as an ex situ process. In other words, the chamber 800 or 801 in which the first and second sub electrodes 132 and 134 are formed may be different from a chamber 810 in which the first and second electrodes 131 and 133 are formed.

Using the operations shown in FIG. 5 or FIG. 11, the first sub electrode 132 having the fourth thickness W4 is formed as shown in FIG. 6 or FIG. 12. Subsequently, as shown in FIG. 16, the first sub electrode 132 is annealed in the chamber 810 as represented by arrows 211. Through annealing, the first sub electrode 132 is oxidized to form the first electrode 131 including the first material. As shown in FIG. 17, the first electrode 131 may have the first thickness W1 greater than the fourth thickness W4, and may include the first material at a first concentration.

After forming the first electrode 131, the second sub electrode 134 is formed on the first electrode 131. The operations of FIG. 7 or FIG. 13 may be used to form the second sub electrode 134. The second sub electrode 134 may have the fifth thickness W5. As shown in FIG. 17, the second sub electrode 134 is annealed in the chamber 810 as represented by arrows 211. Through annealing, the second sub electrode 134 may be oxidized to form the second electrode 133. The second electrode 133 may have the second thickness W2 greater than the fifth thickness W5 of the second sub electrode 134. The second electrode 133 may include the first material at a second concentration.

The fourth thickness W4 is less than the fifth thickness W5. Thus, when the same amount is oxidized, the first concentration of the first material included in the first electrode 131 is higher than the second concentration of the first material included in the second electrode 133.

Subsequently, the third electrode 135 is formed by the method shown in FIG. 9 or FIG. 15, and thus, the MIM capacitor 100 of FIG. 2 may be formed. The first electrode 131 may have the first thickness W1, the second electrode 133 may have the second thickness W2, and the third electrode 135 may have the third thickness W3. The first thickness W1, the second thickness W2 and the third thickness W3 may have a relationship of W3>W2>W1.

Figure 18:
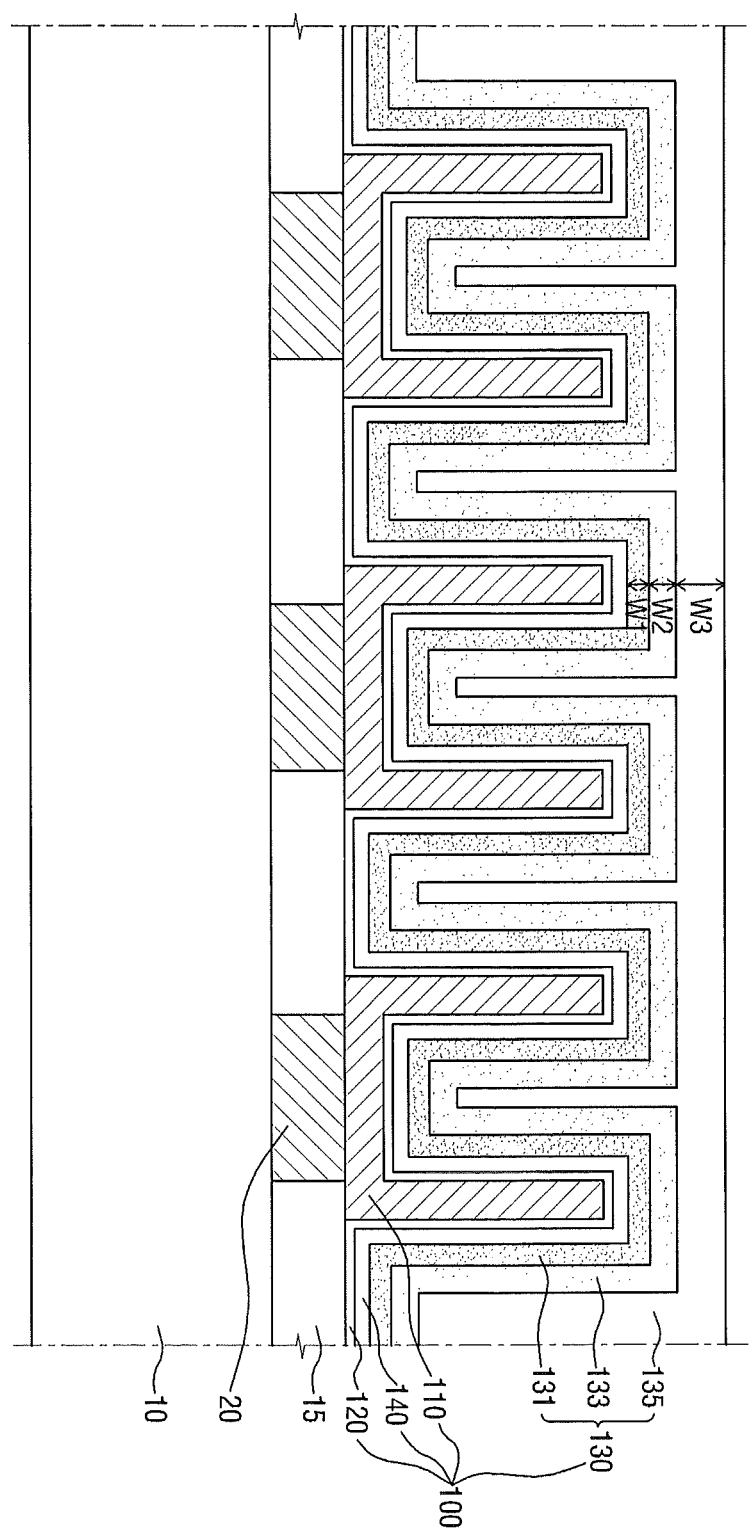
FIG. 18 is a cross-sectional view of a semiconductor device including a MIM capacitor according to some embodiments of the present inventive subject matter.

A semiconductor device including the MIM capacitor 100 according to some embodiments of the present inventive subject matter will now be described with reference to FIG. 18. FIG. 18 is a cross-sectional view of a semiconductor device including a MIM capacitor 100 according to some embodiments of the present inventive subject matter.

Figure 20:
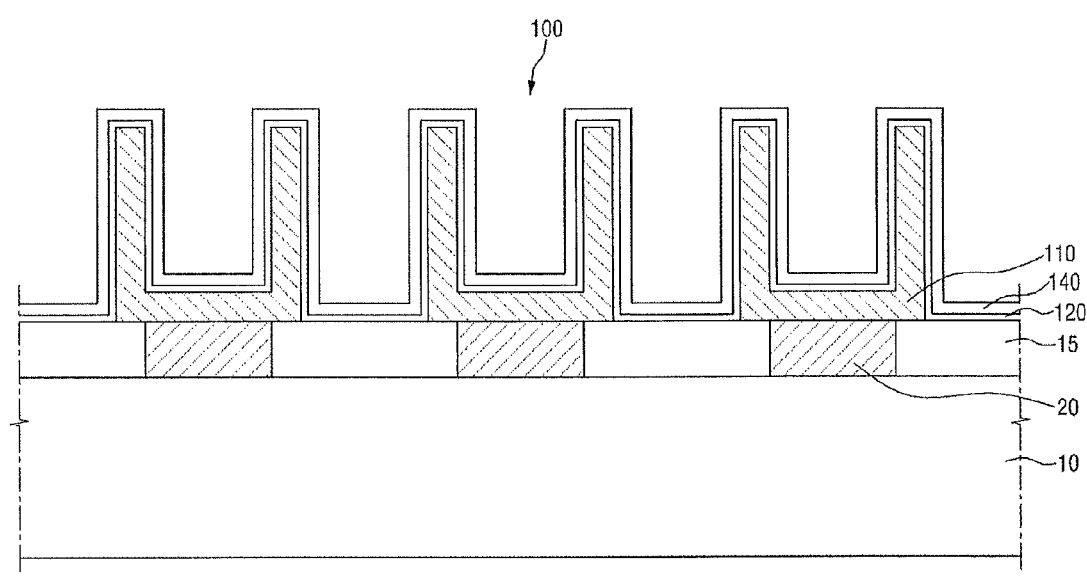

Referring to FIG. 20, a semiconductor device may include a substrate 10, an interlayer insulating film 15, a storage node contact 20 and the MIM capacitor 100. The substrate 10 may be a rigid substrate, such as a silicon substrate, a silicon on insulator (SOI) substrate, a gallium arsenide substrate, a silicon germanium substrate, a ceramic substrate, a quartz substrate, or a glass substrate for display. In some embodiments, the substrate 10 may be a flexible substrate made of a material such as polyimide, polyester, polycarbonate, polyethersulfone, polymethylmethacrylate, polyethylene naphthalate, and polyethyleneterephthalate.

The substrate 10 may include various semiconductor device unit elements, for example, various types of active elements or passive devices. The elements may be, for example, DRAM elements as shown in FIG. 1. The substrate 10 may include element isolation films (not shown) for isolating the unit elements. The interlayer insulating film 15 may be formed on the substrate 10 to cover the unit elements. The substrate 10 may further include conductive areas (not shown) that can be electrically connected to the unit elements through the interlayer insulating film 15.

The interlayer insulating film 15 may include a silicon oxide, such as borosilicate glass (BSG), phosphosilicate glass (PSG), borophosphosilicate glass (BPSG), undoped silicate glass (USG), tetraethlyorthosilicate glass (TEOS), and silicon oxide formed by high density plasma-CVD (HDP-CVD).

The storage node contact 20 may be formed on the substrate 10 to electrically connect the conductive areas to the lower electrode 110 of the MIM capacitor 100, The interlayer insulating film 15 may be patterned and formed on the substrate 10, and the storage node contact 20 may be formed on the exposed substrate 10.

The MIM capacitor 100 may include the lower electrode 110, the dielectric film 120, the protective film 140 and the upper electrode 130.

The lower electrode 110 may be formed on the storage node contact 20. In particular, lower electrodes 110 may be formed on each of a plurality of storage node contacts 20.

Figure 19:
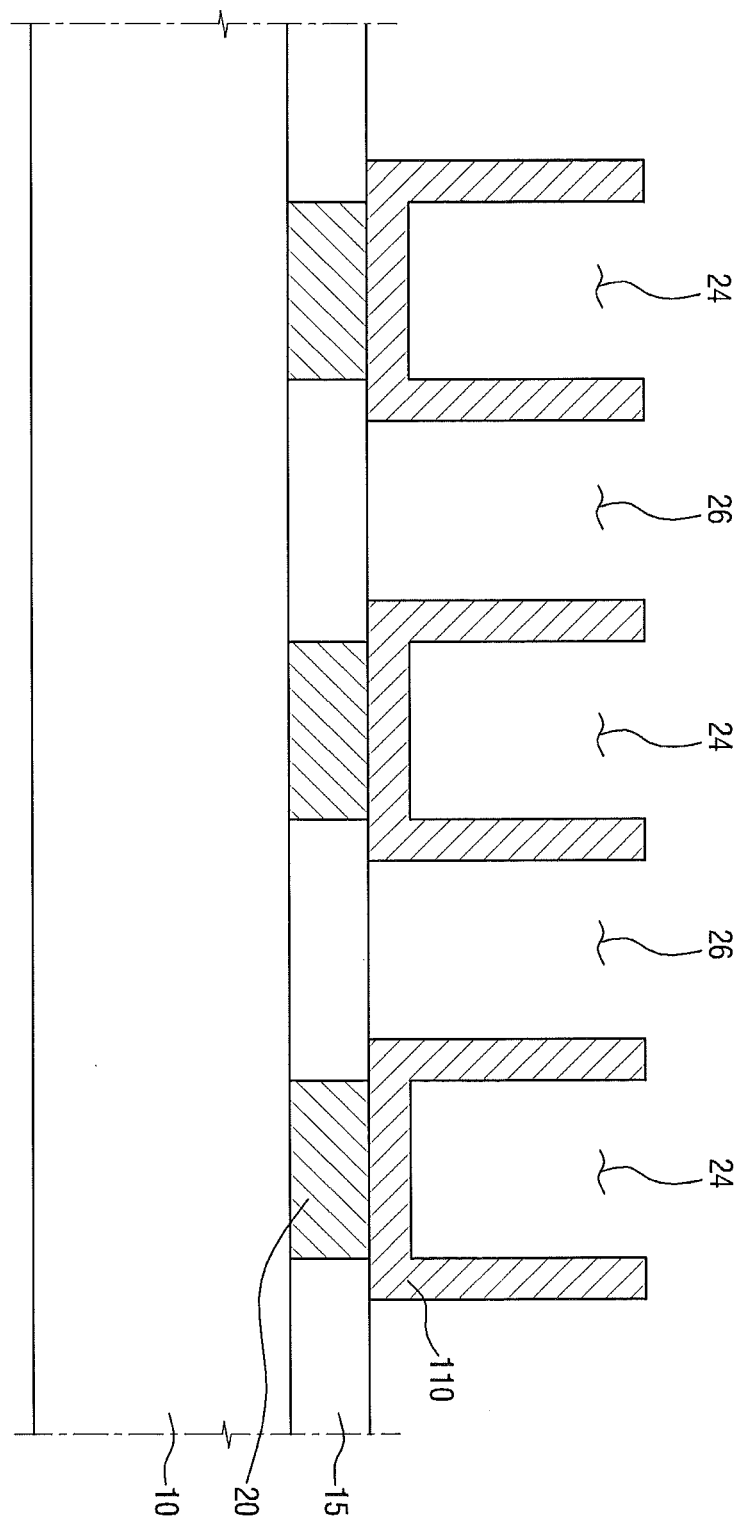
FIGS. 19 and 20 are cross-sectional views showing operations for fabricating a semiconductor device including a MIM capacitor according to some embodiments of the present inventive subject matter.

The lower electrode 110 may have a variety of three-dimensional structures. By the three-dimensional structure of the lower electrode 110, an inside 24 and an outside 26 may be distinguished from each other. As shown in FIG. 19, the lower electrode 110 may have a cylindrical shape, but the shape of the lower electrode 110 is not limited thereto. For example, the lower electrode 110 may have a pillar shape, stack shape, or concave shape, but it is not limited thereto. In the case where the lower electrode 110 is for a cylindrical capacitor, all of an upper surface, an outer surface and an inner surface may be used as capacitor areas. Thus, if the lower electrode 110 has a three-dimensional structure, the effective area of the capacitor may increase, thereby further increasing the capacitance.

The dielectric film 120 includes a high dielectric constant (high-k) material formed on the lower electrode 110. The dielectric film 120 is formed on the inside and the outside to cover the lower electrode 110 having a cylindrical shape. The dielectric film 120 may be formed on the lower electrode 110. Although the dielectric film 120 has been illustrated as a single film in FIG. 21, the dielectric film 120 may include a plurality of stacked films.

The protective film 140 may be formed on the dielectric film 120 to reduce or prevent diffusion of oxygen atoms included in the dielectric film 120 into the upper electrode 130.

The upper electrode 130 is formed on the protective film 140. The upper electrode 130 may include the first material. If the upper electrode 130 includes the first material, it is possible to reduce or prevent diffusion of the oxygen atoms included in the protective film 140 or the dielectric film 120 into the upper electrode 130, and to reduce or prevent reaction of the upper electrode 130 with the oxygen atoms. However, if the upper electrode 130 includes the first material, the resistance of the upper electrode 130 may increase. Therefore, in order to reduce the reaction between the upper electrode 130 and the oxygen atoms included in the dielectric film 120 and/or the protective film 140 while limiting an increase in the resistance of the upper electrode 130, the concentration of the first material may be reduced gradually as it goes from the bottom to the top of the upper electrode 130.

Specifically, the upper electrode 130 may include the first electrode 131, the second electrode 133, and the third electrode 135. The first electrode 131 may include the first material at a first concentration, the second electrode 133 may include the first material at a second concentration, and the third electrode 135 may have a third concentration of the third material, wherein the third concentration may be substantially near zero. The first to third electrodes 131, 133 and 135 may be stacked sequentially on the protective film 140. The concentration of the first material may have a relationship of first concentration>second concentration>third concentration. The third concentration may be zero, i.e., the third electrode 135 may be substantially free of the first material. The second concentration may be reduced gradually from the bottom to the top of the second electrode 133.

The first thickness W1 of the first electrode 131 may be the least, and the third thickness W3 of the third electrode 135 may be the greatest. The second thickness W2 of the second electrode 133 may be between the first thickness W1 and the third thickness W3.

The first material may be oxygen atoms, but it is not limited thereto.

Operations for fabricating a semiconductor device including the MIM capacitor 100 according to further embodiments of the present inventive subject matter will be described with reference to FIGS. 18 to 20.

FIGS. 19 and 20 are cross-sectional views showing intermediate steps for fabricating a semiconductor device including the MIM capacitor 100 according to some embodiments of the present inventive subject matter. Referring to FIG. 18, the interlayer insulating film 15 is formed on the substrate 10. The interlayer insulating film 15 is patterned to expose a specific area of the substrate 10, and the storage node contact 20 is formed on the exposed area. The lower electrode 110 of the MIM capacitor 100 is formed on the storage node contact 20 and is connected to the storage node contact 20. Although a cylindrical lower electrode 110 has been illustrated in FIG. 19, the lower electrode 110 may be formed to have a variety of three-dimensional structures without being limited thereto.

Referring to FIG. 19, a dielectric film 120 is formed conformally on the lower electrode 110 using a high-k material, Specifically, the dielectric film 120 is formed on the inside 24 and the outside 26 of the lower electrode 110.

A protective film 140 is formed conformally on the dielectric film 120. The protective film 140 may reduce or prevent diffusion of the oxygen atoms included in the dielectric film 120 into the upper electrode 130.

Referring to FIG. 20, an upper electrode 130 is formed on the protective film 140. The upper electrode may include a first electrode 131, a second electrode 133 and a third electrode 135 as shown in FIG. 2 stacked sequentially on the protective film 140. The first electrode 131 and the second electrode 133 may be formed conformally, and the third electrode 135 may be formed to fill up the inside 24 and the outside 26 of the lower electrode 110, but it is not limited thereto.

Reaction of the oxygen atoms included in the dielectric film 120 and the protective film 140 with the upper electrode 130 may be reduced or prevented due to the first material included in the upper electrode 130.

Figure 21:
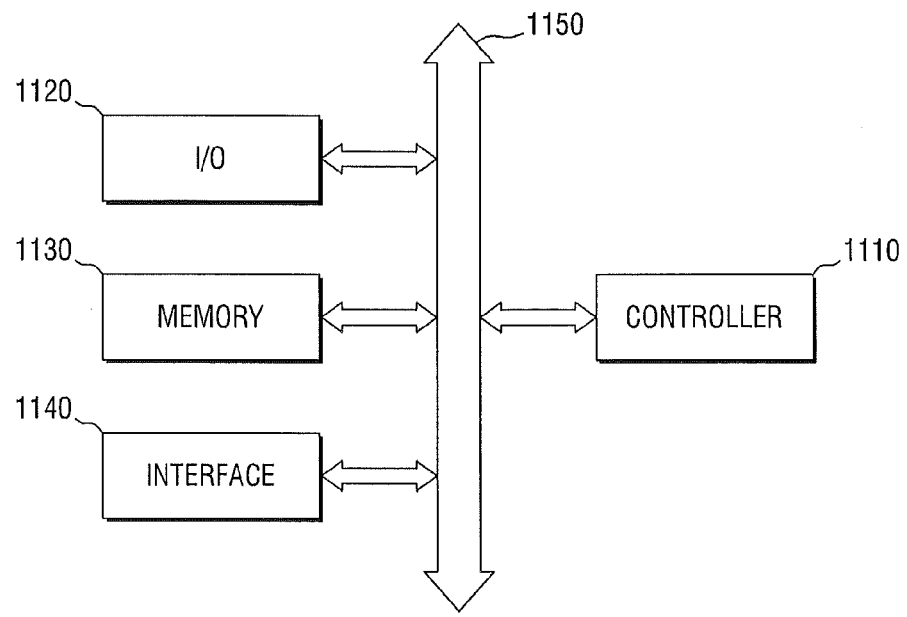
FIG. 21 is a block diagram illustrating an electronic system including a semiconductor device including a MIM capacitor according to some embodiments of the present inventive subject matter.

FIG. 21 is a block diagram showing an example of an electronic system which may include a semiconductor device including a MIM capacitor according to embodiments of the present inventive subject matter. Referring to FIG. 21, an electronic system 1100 according to some embodiments of the present inventive subject matter includes a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 corresponds to a path through which data are transferred.

The controller 1110 may include at least one of a microprocessor, a digital signal processor, a micro-controller and other logic devices capable of performing functions similar to those thereof. The I/O device 1120 may include a keypad, a keyboard and a display device and the like. The memory device 1130 may store data and/or commands. The memory device 1130 may include a semiconductor device including the MIM capacitor 100 according to some embodiments of the present inventive subject matter. The interface 1140 serves to transmit/receive data to/from a communication network. The interface 1140 may be of a wired or wireless type. For example, the interface 1140 may include an antenna or a wired/wireless transceiver or the like.

The electronic system 1100 may be applied to a personal digital assistant (PDA), a portable computer, a web tablet, a wireless phone, a mobile phone, a digital music player, a memory card, or various electronic products capable of transmitting and/or receiving information in a wireless environment.

Figure 22:
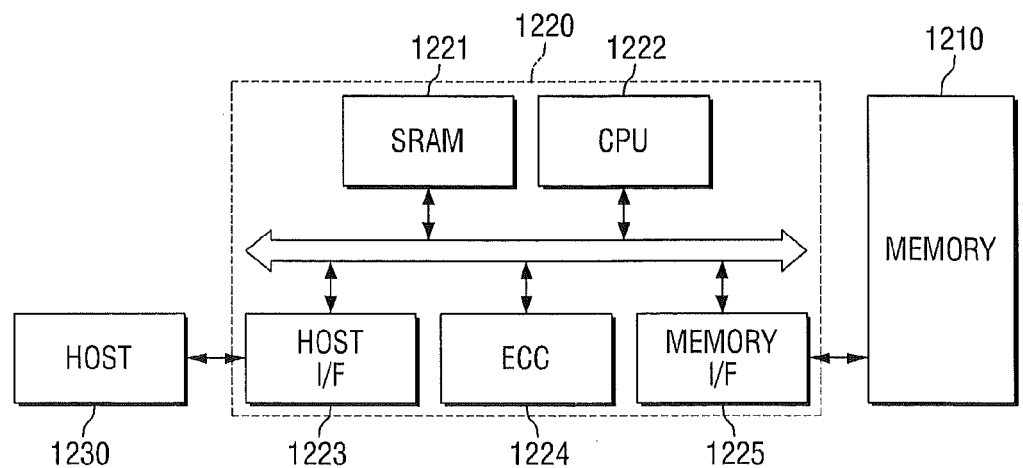
FIG. 22 is a block diagram illustrating a memory card including a semiconductor device including a MIM capacitor according to further embodiments of the present inventive subject matter.

FIG. 22 is a block diagram illustrating a memory card 1200 including a semiconductor device including a MIM capacitor according to embodiments of the present inventive subject matter. Referring to FIG. 22, a memory 1210 including a semiconductor device including a MIM capacitor according to various embodiments of the present inventive subject matter may be employed in the memory card 1200. The memory card 1200 may include a memory controller 1220 to control data exchange between a host 1230 and the memory 1210. An SRAM 1221 may be used as an operating memory of a central processing unit (CPU) 1222. A host interface 1223 may include a protocol to allow the host 1230 to be connected to the memory card 1200 and perform data exchange. An error correction code 1224 may detect and correct errors of data read from the memory 1210. A memory interface 1225 may interface with the memory 1210. The CPU 1222 may perform an overall control operation related to data exchange of the memory controller 1220.

The foregoing is illustrative of the present inventive subject matter and is not to be construed as limiting thereof. Although a few embodiments of the present inventive subject matter have been described, those skilled in the art will readily appreciate that many modifications are possible in the embodiments without materially departing from the novel teachings and advantages of the present inventive subject matter. Accordingly, all such modifications are intended to be included within the scope of the present inventive subject matter as defined in the claims. Therefore, it is to be understood that the foregoing is illustrative of the present inventive subject matter and is not to be construed as limited to the specific embodiments disclosed, and that modifications to the disclosed embodiments, as well as other embodiments, are intended to be included within the scope of the appended claims. The present inventive subject matter is defined by the following claims, with equivalents of the claims to be included therein.

What is claimed is:

1. A metal-insulator-metal (MIM) capacitor comprising:
a storage node contact passing through an interlayer insulating film;
a lower electrode on and electrically connected to the storage node contact;
a dielectric film on the lower electrode; and
an upper electrode on the dielectric film and comprising a first metal nitride electrode including a first material at a first concentration, a second metal nitride electrode on the first electrode and including the first material at a second concentration, and a third metal nitride electrode on the second electrode and having a third concentration of the first material, wherein the first, second and third concentrations are different from one another and wherein the second concentration is lower than the first concentration and higher than the third concentration.

2. The MIM capacitor of claim 1, wherein the first, second, and third metal nitride electrodes comprise respective first, second and third metal nitride layers stacked on the dielectric film, wherein the second metal nitride layer is disposed directly on the first metal nitride layer, and wherein the third metal nitride layer is disposed directly on the second metal nitride layer.

3. The MIM capacitor of claim 2, wherein the first metal nitride electrode is thinner than each of the second and third metal nitride electrodes.

4. The MIM capacitor of claim 3, wherein the first metal nitride electrode has a thickness of about 1 Å to about 50 Å.

5. The MIM capacitor of claim 2, wherein the third metal nitride electrode is thicker than each of the first and second electrodes.

6. The MIM capacitor of claim 1, wherein the third metal nitride electrode is substantially free of the first material.

7. The MIM capacitor of claim 1, wherein the second concentration decreases as from a bottom to a top of the second electrode.

8. The MIM capacitor of claim 1, wherein the first material comprises oxygen atoms.

9. The MIM capacitor of claim 1, further comprising a protective film disposed between the dielectric film and the upper electrode.

* * * * *